(12) United States Patent
Patil et al.

(10) Patent No.: US 10,218,369 B2
(45) Date of Patent: Feb. 26, 2019

(54) SYSTEMS AND METHODS FOR DELAY-BASED CONTINUOUS TIME PROCESSING

(71) Applicant: THE TRUSTEES OF COLUMBIA UNIVERSITY IN THE CITY OF NEW YORK, New York, NY (US)

(72) Inventors: Sharvil Pradeep Patil, New York, NY (US); Yannis Tsividis, New York, NY (US); Yu Chen, Shanghai (CN)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/815,968

(22) Filed: Nov. 17, 2017

(65) Prior Publication Data

US 2018/0138918 A1    May 17, 2018

Related U.S. Application Data

(60) Provisional application No. 62/423,317, filed on Nov. 17, 2016.

(51) Int. Cl.
*H03M 1/00* (2006.01)
*H03M 1/60* (2006.01)

(52) U.S. Cl.
CPC ........... *H03M 1/002* (2013.01); *H03M 1/001* (2013.01); *H03M 1/60* (2013.01)

(58) Field of Classification Search
CPC .............................. H03M 1/002; H03M 1/001
USPC ................................................ 341/110–144
See application file for complete search history.

(56) References Cited

U.S. PATENT DOCUMENTS

| 7,579,969 | B2* | 8/2009 | Tsividis | H03M 1/124 341/110 |
| 8,749,421 | B2* | 6/2014 | Kurchuk | H04R 25/00 341/155 |
| 9,344,107 | B1* | 5/2016 | Morche | H03M 3/368 |
| 9,614,510 | B2* | 4/2017 | Srinivasan | H03K 5/159 |
| 9,876,490 | B2* | 1/2018 | Tsividis | H03K 5/14 |

(Continued)

OTHER PUBLICATIONS

Agarwal et al., "A 320mV-to-1.2V On-Die Fine-Grained Reconfigurable Fabric for DSP/Media Accelerators in 32nm CMOS," 2010 IEEE International Solid-State Circuits Conference Digest of Technical Papers (ISSCC), vol. 53, pp. 328-329 (2010).

(Continued)

*Primary Examiner* — Lam T Mai
(74) *Attorney, Agent, or Firm* — Wilmer Cutler Pickering Hale and Dorr LLP (57) ABSTRACT

Disclosed herein are some continuous time systems and methods. Some of the disclosed systems and methods use a continuous-time analog-to-digital converter (ADC) configured to receive an analog input and to generate an ADC output, a continuous-time digital signal processor configured to receive the ADC output and generate one or more digital outputs, one or more digital-to-analog converters configured to receive the one or more digital outputs, each digital-to-analog converter configured to receive a corresponding digital output and generate an analog output, and an adder configured to receive the analog outputs of the one or more digital-to-analog converters and to generate a summed analog output.

18 Claims, 10 Drawing Sheets

(56) References Cited

U.S. PATENT DOCUMENTS

| | | | | |
|---|---|---|---|---|
| 2004/0263375 | A1* | 12/2004 | Tsividis | G06F 7/5443 |
| | | | | 341/158 |
| 2012/0188107 | A1* | 7/2012 | Ashburn, Jr. | H03M 3/344 |
| | | | | 341/110 |
| 2014/0253199 | A1* | 9/2014 | Tsividis | H03K 5/14 |
| | | | | 327/261 |
| 2016/0269045 | A1* | 9/2016 | Srinivasan | H03M 3/37 |
| 2017/0187387 | A1* | 6/2017 | Srinivasan | H03M 3/38 |
| 2017/0331467 | A1* | 11/2017 | Tsividis | H03K 5/14 |

OTHER PUBLICATIONS

Ross, "Theoretical Study of Pulse-Frequency Modulation," Proceedings of the IRE, vol. 37, issue 11, pp. 1277-1286 (1949).

Bayly, "Spectral analysis of pulse frequency modulation in the nervous systems," IEEE Trans. Biomed. Eng., vol. BME-15, issue 4, pp. 257-265 (1968).

Kurchuk and Tsividis, "Energy-Efficient Asynchronous Delay Element with Wide Controllability," Proceedings of 2010 IEEE International Symposium on Circuits and Systems (ISCAS), pp. 3837-3840 (2010).

Kurchuk et al., "Event-driven GHz-range continuous-time digital signal processor with activity-dependent power dissipation," IEEE J. Solid-State Circuits, vol. 47, issue 9, pp. 2164-2173 (2012).

Murmann, "ADC Performance Survey 1997-2017," Retrieved online <https://web.stanford.edu/~murmann/adcsurvey.html>, 3 pages (1997-2017).

O'hAnnaidh et al., "A 3.2GHz-sample-rate 800MHz bandwidth highly reconfigurable analog FIR filter in 45nm CMOS," 2010 IEEE International Solid-State Circuits Conference Digest of Technical Papers (ISSCC), vol. 53, pp. 90-91 (2010).

Patil et al., "A 3-10 fJ/conv-step Error-Shaping Alias-Free Continuous-Time ADC," IEEE J. Solid-State Circuits, vol. 51, issue 4, pp. 908-918 (2016).

Rochelle, "Pulse-Frequency Modulation," IRE Transactions on Space Electronics and Telemetry, pp. 107-111 (1962).

Roza, "Analog-to-digital conversion via duty-cycle modulation," IEEE Trans. Circuits Syst. II Analog Digit. Signal Process., vol. 44, issue 11, pp. 907-914 (1997).

Schell and Tsividis, "A Clockless ADC/DSP/DAC System with Activity-Dependent Power Dissipation and No Aliasing," ISSCC 2008 Digest of Technical Papers IEEE International Solid-State Circuits Conference, pp. 550-551, 635 (2008).

Schell and Tsividis, "A continuous-time ADC/DSP/DAC system with no clock and with activity-dependent power dissipation," IEEE J. Solid-State Circuits, vol. 43, issue 11, pp. 2472-2481 (2008).

Schell and Tsividis, "A low power tunable delay element suitable for asynchronous delays of burst information," IEEE J. Solid-State Circuits, vol. 43, issue 5, pp. 1227-1234 (2008).

Toifl et al., "A 3.5pJ/bit 8-tap-feed-forward 8-tap-decision feedback digital equalizer for 16Gb/s I/Os," 40th European Solid State Circuits Conference (ESSCIRC), ESSCIRC 2014—40th, pp. 455-458 (2014).

Tousi and Afshari, "A miniature 2 mW 4 bit 1.2 GS/s delay-line-based ADC in 65 nm CMOS," IEEE J. Solid-State Circuits, vol. 46, issue 10, pp. 2312-2325 (2011).

Vandeursen and Peperstraete, "Analog-to-Digital Conversion Based on a Voltage-to-Frequency Converter," IEEE Trans. Ind. Electron. Control Instrum., vol. IECI-26, issue 3, pp. 161-166 (1979).

Vezyrtzis et al., "A flexible, event-driven digital filter with frequency response independent of input sample rate," IEEE J. Solid-State Circuits, vol. 49, issue 10, pp. 2292-2304 (2014).

Weltin-Wu and Tsividis, "An event-driven clockless level-crossing ADC with signal-dependent adaptive resolution," IEEE J. Solid-State Circuits, vol. 48, issue 9, pp. 2180-2190 (2013).

* cited by examiner

SYSTEMS AND METHODS FOR DELAY-BASED CONTINUOUS TIME PROCESSING

CROSS-REFERENCE TO RELATED PATENT APPLICATIONS

This application claims priority to and the benefit under 35 U.S.C. § 119(e) of U.S. Provisional Patent Application No. 62/423,317, filed Nov. 17, 2016 and titled "Delay-Based Continuous Time ADC/DSP/DAC System," the contents of which are hereby incorporated by reference in their entirety.

STATEMENT REGARDING FEDERALLY SPONSORED RESEARCH

This invention was made with government support under grant number 0964606 awarded by the NATIONAL SCIENCE FOUNDATION. The government has certain rights in the invention.

FIELD OF THE DISCLOSURE

The present application disclosure relates to methods and systems for continuous-time digital signal processing.

BACKGROUND

Continuous-time (CT) digital signal processing (DSP) has great potential, but can be constrained in its energy efficiency, because, for example, CT DSP systems may include a preceding continuous-time analog-to-digital encoder, which dissipates extra energy. Some prior art CT DSP systems implement level-crossing sampling (LCS) encoders, which can exhibit exponential worsening of CT DSP constraints, such as the number of output tokens produced per second by the encoder (NTPS) and the minimum time between two consecutive output encoder tokens ($T_{GRAN}$), as the encoder resolution increases. Once the continuous-time encoder is selected, brute-force parallelization can be used to optimize the CT DSP. This has restricted prior art CT DSP systems to either low resolution or low bandwidth. A delay-based continuous-time analog-to-digital encoder can result in a low-supply implementation that can scale to provide high resolution. Therefore, there is a need for a delay-based continuous-time analog-to-digital encoder to address the problems identified in prior art CT DSP systems.

SUMMARY

According to aspects of the disclosure, a continuous-time system is provided. The continuous-time system can include a continuous-time analog-to-digital converter (ADC), a continuous-time digital signal processor configured to receive the ADC output and generate one or more digital outputs, one or more digital-to-analog converters configured to receive the one or more digital outputs, each digital-to-analog converter configured to receive a corresponding digital output and generate an analog output, and an adder configured to receive the analog outputs of the one or more digital-to-analog converters and to generate a summed analog output.

According to aspects of the disclosure, the ADC output can include one or more continuous-time digital fixed-width pulses having a repetition rate determined based on an amplitude of the analog signal.

According to aspects of the disclosure, the continuous-time analog-to-digital converter can include one or more asynchronous digital delay blocks, each asynchronous digital delay block having a tunable delay.

According to aspects of the disclosure, the tunable delay is determined based on the analog input.

According to aspects of the disclosure, the one or more asynchronous digital delay blocks form a feedback loop.

According to aspects of the disclosure, wherein the continuous-time digital signal processor can include one or more asynchronous digital delay blocks, each asynchronous digital delay block having a tunable delay.

According to aspects of the disclosure, the ADC output is multiplied by a first coefficient, wherein the ADC output is configured to propagate through the one or more asynchronous digital delay blocks, and wherein the ADC output is further multiplied by a corresponding coefficient after the ADC output propagates through each of the one or more asynchronous digital delay blocks.

According to aspects of the disclosure, the continuous-time analog-to-digital converter can include a first set of one or more asynchronous digital delay blocks and a second set of one or more asynchronous digital delay blocks, wherein the continuous-time analog-to-digital converter is further configured to generate a second ADC output, and wherein an asynchronous digital delay block of the first set of one or more asynchronous digital delay blocks generates the ADC output and an asynchronous digital delay block of the second set of one or more asynchronous digital delay blocks generates the second ADC output.

According to aspects of the disclosure, the continuous-time digital signal processor is further configured to receive the second ADC output and wherein the continuous-time digital signal processor can include a third set of one or more asynchronous digital delay blocks configured to receive the ADC output and a fourth set of one or more asynchronous digital delay blocks configured to receive the second ADC output.

According to aspects of the disclosure, the ADC output and the second ADC output are multiplied by a first coefficient, wherein the ADC output is configured to propagate through the third set of one or more asynchronous digital delay blocks, wherein the second ADC output is configured to propagate through the fourth set of one or more asynchronous digital delay blocks, and wherein the ADC output and the second ADC output are further multiplied by a corresponding coefficient after the ADC output propagates through each of the one or more asynchronous digital delay blocks of the third set of one or more asynchronous digital delay blocks and after the second ADC output propagates through each of the one or more asynchronous digital delay blocks of the fourth set of one or more asynchronous digital delay blocks.

According to aspects of the disclosure, a method for continuous-time processing is provided. The method can include the steps of receiving, by a continuous-time analog-to-digital converter (ADC), an analog input and to generate an ADC output; receiving, by a continuous-time digital signal processor, the ADC output and generate one or more digital outputs; receiving, by one or more digital-to-analog converters, the one or more digital outputs, each digital-to-analog converter configured to receive a corresponding digital output and generate an analog output; and summing, by an adder, the analog outputs of the one or more digital-to-analog converters to generate a summed analog output.

According to aspects of the disclosure, the method can further include the steps of generating, by the continuous-time analog-to-digital converter, a second ADC output, and wherein the ADC output is generated by an asynchronous digital delay block of a first set of one or more asynchronous digital delay blocks, and wherein the second ADC output is generated by an asynchronous digital delay block of a second set of one or more asynchronous digital delay blocks.

According to aspects of the disclosure, the method can further include the steps of receiving, by a third set of one or more asynchronous digital delay blocks in the continuous-time digital signal processor, the ADC output; and receiving, by a fourth set of one or more asynchronous digital delay blocks in the continuous-time digital signal processor, the second ADC output.

According to aspects of the disclosure, the method can further include the steps of multiplying the ADC output and the second ADC output by a first coefficient; propagating the ADC output through the third set of one or more asynchronous digital delay blocks; propagating the second ADC output through the fourth set of one or more asynchronous digital delay blocks; and multiplying the ADC output and the second ADC output by a corresponding coefficient after the ADC output propagates through each of the one or more asynchronous digital delay blocks of the third set of one or more asynchronous digital delay blocks and after the second ADC output propagates through each of the one or more asynchronous digital delay blocks of the fourth set of one or more asynchronous digital delay blocks.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

The disclosed systems and methods provide implementations of pulse frequency modulation (PFM) using one or more asynchronous digital delay blocks. The disclosed systems and methods provide a continuous-time digital processor, which can include a delay line using one or more asynchronous digital delay blocks. The disclosed systems and methods provide a continuous-time (CT) analog-to-digital converter (ADC)/digital-signal-processing (DSP)/digital-to-analog-converter (DAC) system that can include asynchronous digital delays, where the resulting implementation can scale and is low power.

Figure 1:
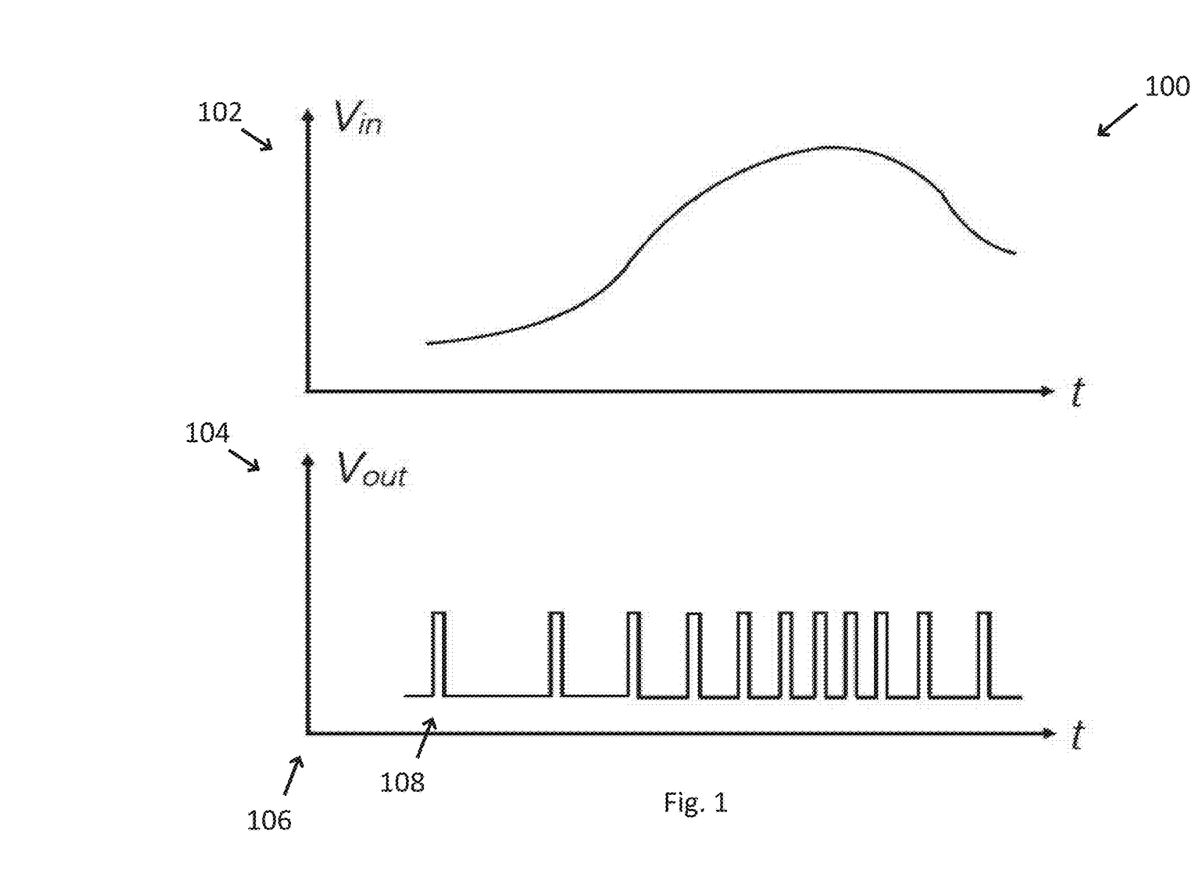
FIG. 1 shows an exemplary illustration of pulse frequency modulation, according to aspects of the disclosure.

According to aspects of the disclosure, the disclosed encoders can implement PFM, where an analog input signal can modulate the repetition rate of 1-bit digital pulses. According to pulse-frequency modulation, the higher the input amplitude, the higher the repetition rate and vice versa. More specifically, a pulse frequency modulator can convert an analog input into a stream of fixed-width pulses at its output, whose repetition rate (hereinafter "pulse frequency") can vary linearly with the applied input. FIG. 1 shows an exemplary pulse frequency modulation 100. It has an analog input 102 and a stream of fixed-width pulses at its output 104. The stream of fixed-width pulses 104 becomes dense as the input 102 amplitude increases and the stream of fixed-width pulses 104 becomes sparse when the input 102 amplitude decreases. The analog input 102 thus modulates the pulse frequency 104 at the output, resulting in pulse frequency modulation (PFM).

The time between an origin 106 where t=0 and the nearest output PFM pulse is a random variable, $\alpha$. Given the random nature of this variable in PFM, the occurrence of an output pulse is a random event with regard to the time origin. The output pulse train can be represented as $p(t, \alpha)$.

The PFM encoder produces a pulse train at its output even when the input is zero (or at its common mode value). This zero-input pulse train has a fixed frequency of oscillation, termed the unmodulated pulse frequency, $f_0$.

The instantaneous output pulse frequency, $f_{out}$, can be defined based on the time rate at which the rising edges of the output pulses occur, and its input dependence can then be expressed as:

$$f_{out}(t) = f_0 + K_{VCO} v_{in}(t) \tag{1}$$

where $v_{in} \in [-A, A]$ (unit: Volt), is the input amplitude and; $K_{VCO}$ (unit: Hz/V) is termed the "gain" of the modulator; and $f_0$ (unit: Hz), as described above, is the zero-input oscillation frequency of the modulator output. $\Delta f_p = K_{VCO} A$ is the maximum pulse frequency deviation (unit: Hz), of the output oscillation frequency from what it is for a zero input.

According to aspects of the disclosure, this form of encoding can also be achieved using other decoders, for example, a voltage-to-frequency converter.

The spectral description of an exemplary PFM for a sinusoidal input and rectangular pulses, $p(t,\alpha)$, at the output is discussed below. The sinusoidal input can be described as shown below:

$$v_{in}(t) = A \cos(2\pi f_{in} t + \theta) \tag{2}$$

The output PFM pulses can be expressed as a sum of infinite cosine components as:

$$p(t, \alpha) = \tag{3}$$

$$V_{PUL} T_{PW} f_0 + V_{PUL} T_{PW} \Delta f_p \frac{\sin(\pi T_{PW} f_{in})}{\pi T_{PW} f_{in}} \cos(2\pi f_{in} t - \pi T_{PW} f_{in} + \theta) +$$

$$2 V_{PUL} T_{PW} f_0 \sum_{k=1}^{\infty} \sum_{n=-\infty}^{\infty} J_n\left(\frac{k \Delta f_p}{f_{in}}\right) \frac{\sin(\pi T_{PW}(k f_0 + n f_{in}))}{\pi T_{PW} k f_0} \times$$

-continued
$$\cos[2\pi(kf_0 + nf_{in})t - \pi T_{PW}(kf_0 + nf_{in}) + 2\pi kf_0\alpha] +$$
$$n\theta - \frac{k\Delta f_p}{f_{in}}\sin(\theta - 2\pi f_{in}\alpha)]$$

where $V_{PUL}$ and $T_{PW}$ are respectively the amplitude and width of the PFM output pulses, $f_0$ is the unmodulated pulse frequency, $\Delta f_p = K_{VCO}A$ represents the modulation depth, and $J_n$ is a Bessel function of the first kind of order n.

Equation (3) can be simplified by approximating the pulses, p(t,α), as impulses by taking the limit as $V_{PUL} \to \infty$ and $T_{PW} \to 0$, and assuming the resulting impulses have strength, $S_1 = V_{PUL}T_{PW}$. Equation 3 can be re-written as:

$$p(t, \alpha) = S_1 f_0 + S_1 \Delta f_p \cos(2\pi f_{in}t + \theta) + \qquad (4)$$
$$2S_1 f_0 \sum_{k=1}^{\infty} \sum_{n=-\infty}^{\infty} J_n\left(\frac{k\Delta f_p}{f_{in}}\right)\left(1 + \frac{nf_{in}}{kf_0}\right) \times \cos[2\pi(kf_0 + nf_{in})t + 2\pi kf_0\alpha] +$$
$$n\theta - \frac{k\Delta f_p}{f_{in}}\sin(\theta - 2\pi f_{in}\alpha)]$$

Figure 2:
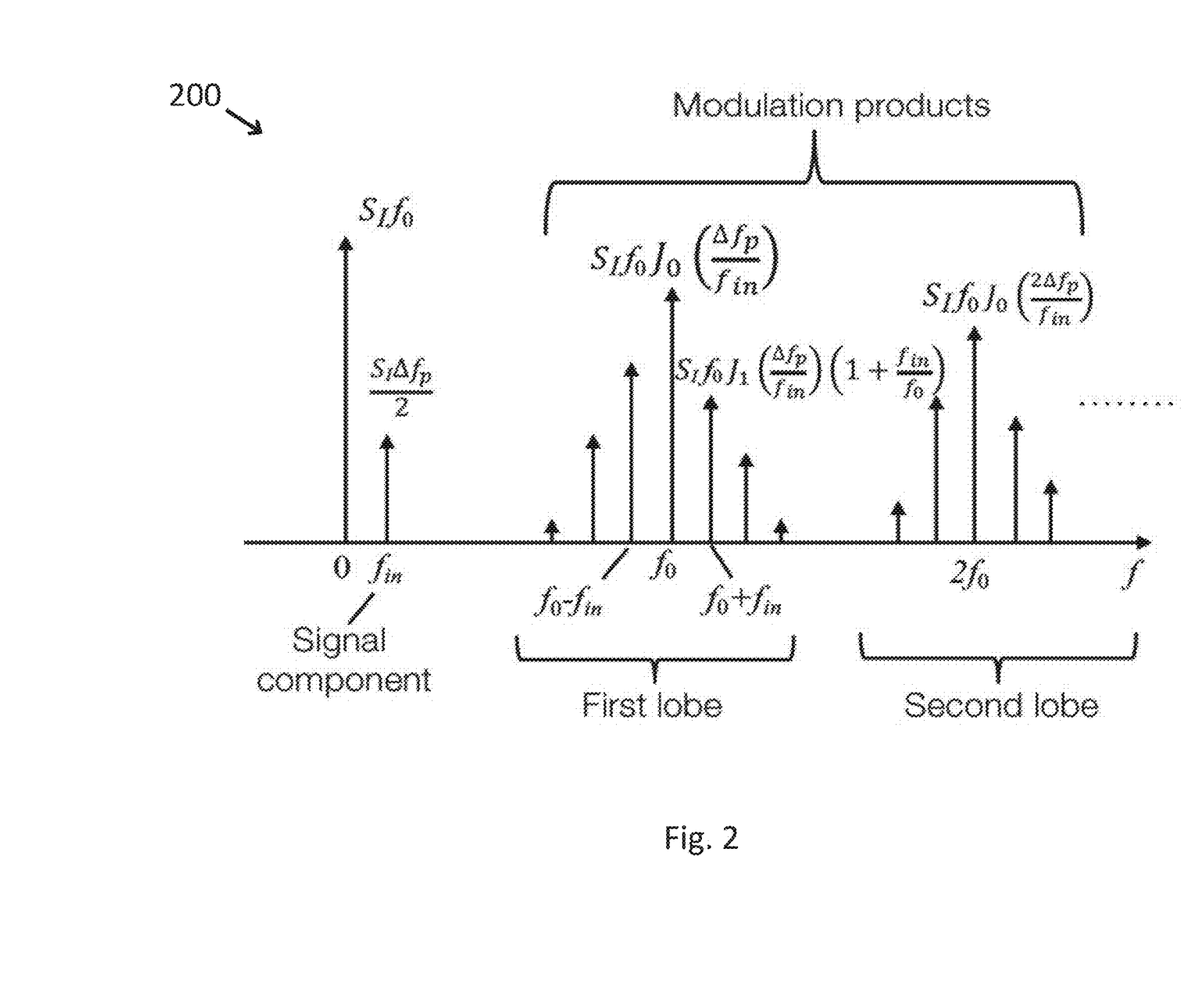
FIG. 2 shows an exemplary output spectrum of pulse-frequency modulated signal, according to aspects of the disclosure.

Equation (4) is an adequate representation independent of the pulse shape, provided the area of the pulse is concentrated over a duration that is much smaller than the total period. The components in equations (3) and (4) can represent the frequency spectrum components of p(t, α), and they can provide the magnitude and frequency of the terms in its Fourier transform. FIG. 2 shows an exemplary output spectrum of a pulse-frequency modulated signal 200, where the component magnitudes are from the expression in either equation (3) or equation (4).

The zero-frequency spectrum component, which represents the average of the output pulse train, has an amplitude of $S_1 f_0$. The signal component, located at $f_{in}$, has a magnitude given by $$v_{out,sig} = \frac{S_1 \Delta f_p}{2} \qquad (5)$$

which is proportional to the frequency deviation, $\Delta f_p$, and the impulse strength, $S_1$.

The remaining terms are the modulation products at $kf_0 \pm nf_{in}(k, n \in I, f_0 = N_{phi} \times 2f_c)$. They form "lobes" centered at $kf_0$. The individual modulation product components have amplitudes given by Bessel functions of the first kind and order $$n, J_n\left(\frac{k\Delta f_p}{f_{in}}\right).$$

The first lobe (k=1) can be important as it is the closest one to the baseband. Therefore, the following discussion assumes k=1. If $f_0 \gg f_{in}$, the modulation products that fall in the signal band have negligible amplitudes. Therefore, the signal band can only have the signal component at $f_{in}$, without any of its harmonics. Such a practically-distortion-free signal band then allows demodulation with a low-pass filter that can reject the out-of-band high frequency modulation products.

The PFM output with rectangular pulses, expressed in equation (3), can be thought of as one obtained by passing the impulse-form output in equation (4) through a filter that converts an input impulse into a pulse of fixed width, $T_{PW}$. Such a filter has an impulse response given by $$h(t) = rect\left(\frac{t}{T_{PW}} - \frac{1}{2}\right)$$

and presents a low-pass sinc transfer function, which explains the sinc terms in equation (3), given by: $H(f) = T_{PW}\text{sinc}(\pi f T_{PW})e^{-j\pi f T_{PW}}$, which provides spectral nulls at integer multiples of $1/T_{PW}$. Therefore, a non-zero pulse width gives a low-pass filtering effect that can be used to limit the bandwidth of the output spectrum. The higher the pulse width, $T_{PW}$, the better the attenuation at high frequencies. However, $T_{PW}$ has to be kept smaller than the minimum time between two consecutive output pulses.

According to aspects of the disclosure, the output spectrum of a PFM signal can include the baseband signal component and an infinite number of modulation products whose strength dies down with frequency in a manner that those that fall in the baseband have negligible amplitude. The baseband spectrum at the output is thus practically distortion free and a high signal-to-distortion ratio is obtained.

Figure 3:
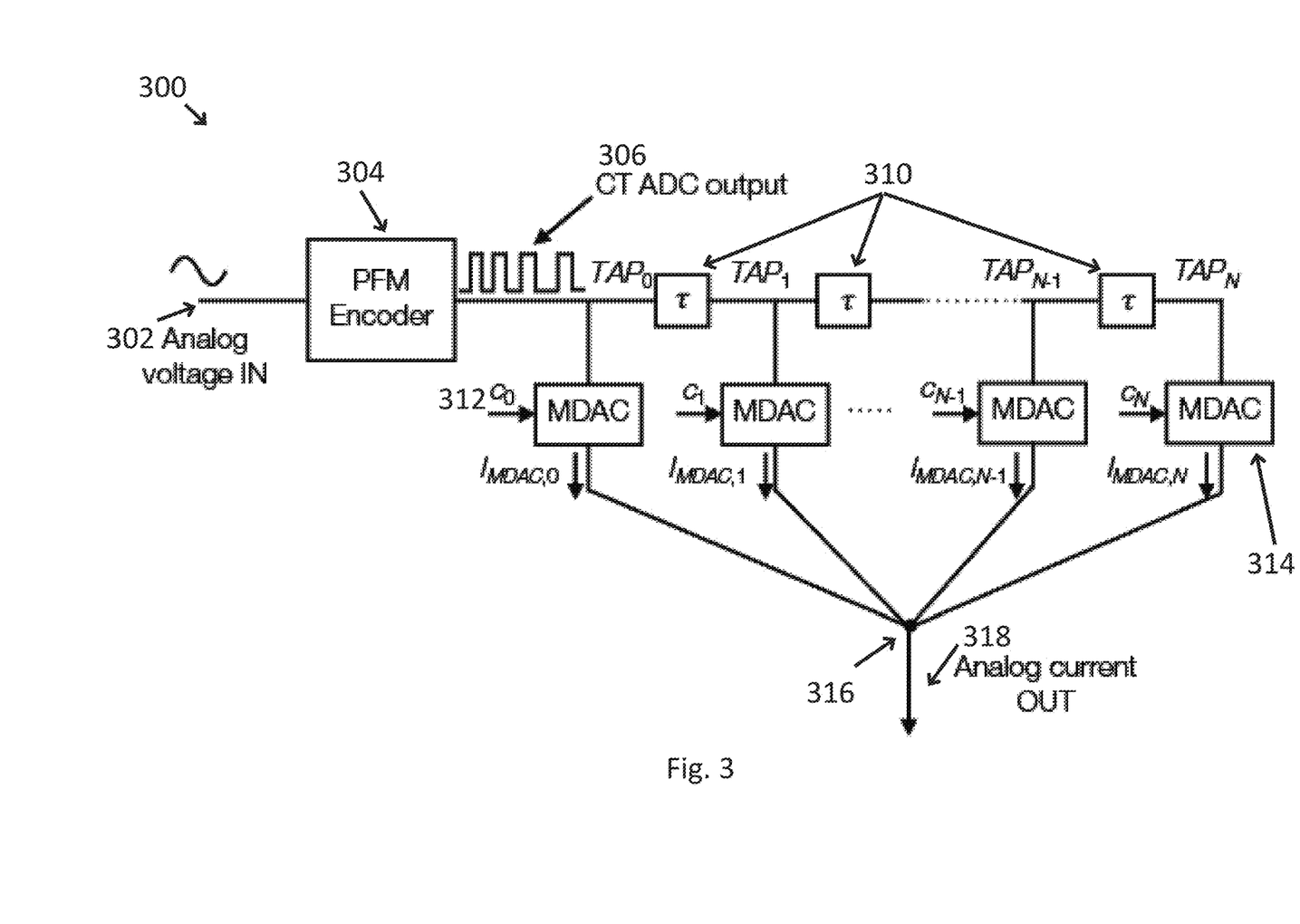
FIG. 3 shows a top-level architecture of an exemplary Pulse Position Modulation (PPM) encoder-based continuous-time (CT) analog-to-digital converter (ADC)/digital-signal-processor (DSP)/digital-to-analog-converter (DAC) system, according to aspects of the disclosure.

FIG. 3 shows a top-level architecture of an exemplary continuous-time system 300. System 300 has a continuous-time analog-to-digital converter (CT ADC) implemented, for example, as a PFM encoder 304, which can convert an analog input signal 302 into a train of fixed-width 1-bit CT digital pulses—the CT analog to digital converter output 306. The repetition rate or frequency of the analog to digital converter output 306 can vary in proportion to the amplitude of the analog input signal 302. As discussed above, the higher the amplitude, the higher the frequency and vice versa. The analog to digital converter output 306, can be fed into a continuous-time digital signal processor, which implements, for example, a finite impulse response (FIR) filter. A finite impulse response filter can have a delay line, which can be implemented as a cascade of asynchronous digital tap delays 310, each delay being represented by "τ" and can also include coefficient multipliers 312, and one or more adders. The outputs of the finite impulse response filter can be fed to a continuous-time digital-to-analog converter (DAC), which can generate a continuous-time analog output 318. Each multiplying digital to analog converter (MDAC) 314 can multiply the pulses at each tap 310 output with a coefficient $c_i$ 312 and can output a multiplied signal. The output signals of all MDACs 314 can be summed by shorting their outputs together and connecting to a low-impedance node 316.

According to aspects of the disclosure, because of the 1-bit encoding, the coefficient multiplier 312 at each FIR tap can be implemented as a simple pass gate and can be combined with a digital-to-analog converter to form MDAC 314. The digital-to-analog converter at each FIR tap can output a current proportional to the multiplier output, which is the set filter tap coefficient. The output nodes of all digital-to-analog converters are shorted to perform addition in the current domain, thereby generating a current output 318, which can be then taken off-chip. The system 300 thus has a CT analog voltage input 302 and a CT analog current output 318.

Figure 4:
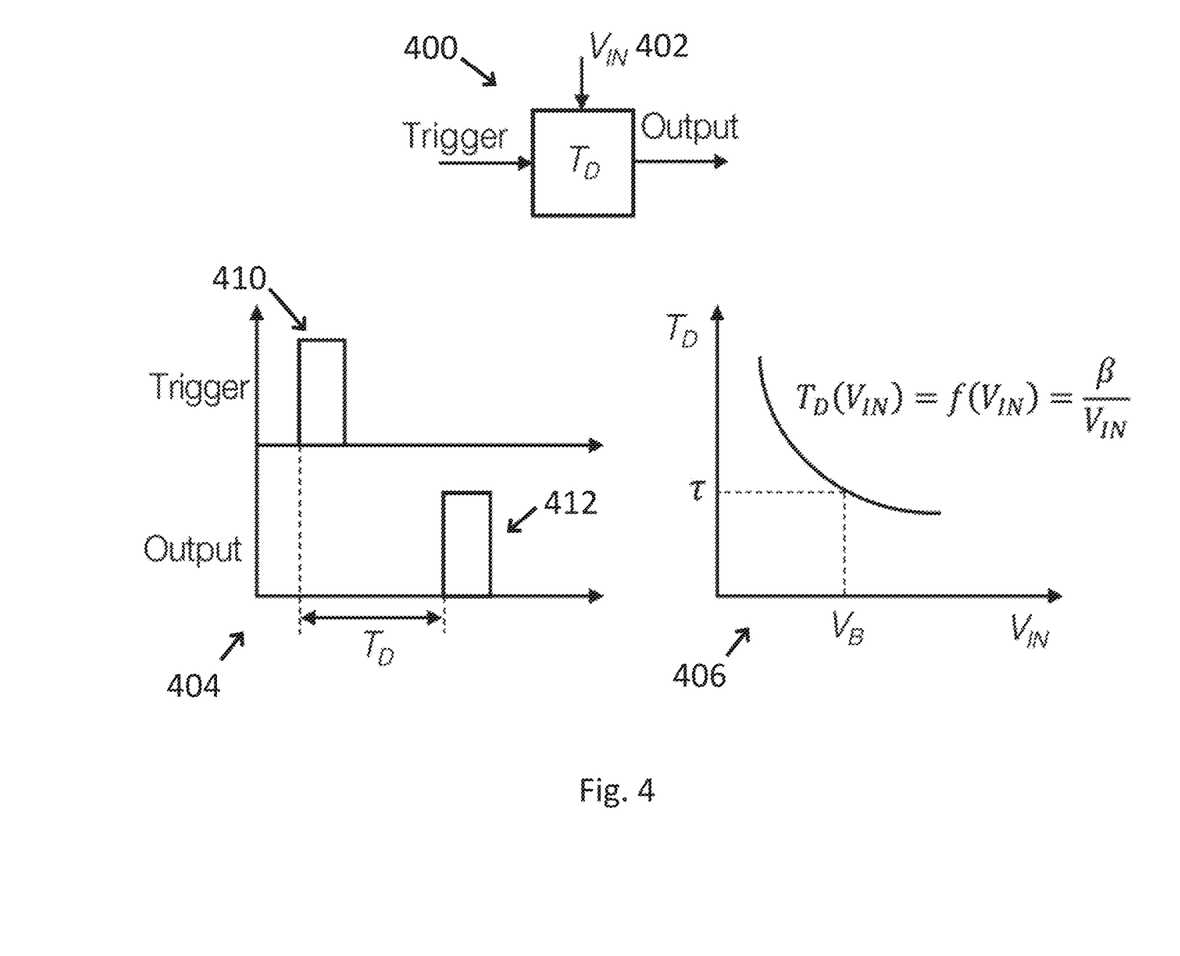
FIG. 4 shows an exemplary illustration of an asynchronous digital delay cell, according to aspects of the disclosure.

According to aspects of the disclosure, a PFM encoder can be implemented using asynchronous digital delay blocks. The tap delay block 310, for example, can be implemented using a voltage-controlled asynchronous digital delay block as shown in FIG. 4 at 400. The asynchronous digital delay block 400 can take a continuous time input digital pulse 410 and can produce a similar output pulse 412 after a delay $T_D$ as shown in FIG. 4 at 404. This delay can be tuned using the voltage control terminal 402, $V_{IN}$. According to aspects of the disclosure, $T_D$ can be inversely proportional to $V_{IN}$ as shown below:

$$T_D(V_{IN}) = \frac{\beta}{V_{IN}} \quad (6)$$

where $\beta$ is a constant.

A corresponding plot representing equation (6) is shown in FIG. 4 at 406. As shown, in FIG. 4, when $V_{IN}=V_B$, delay "τ" is obtained; such a delay can be used in the delay line in the continuous-time digital processor of FIG. 3.

Figure 5A:
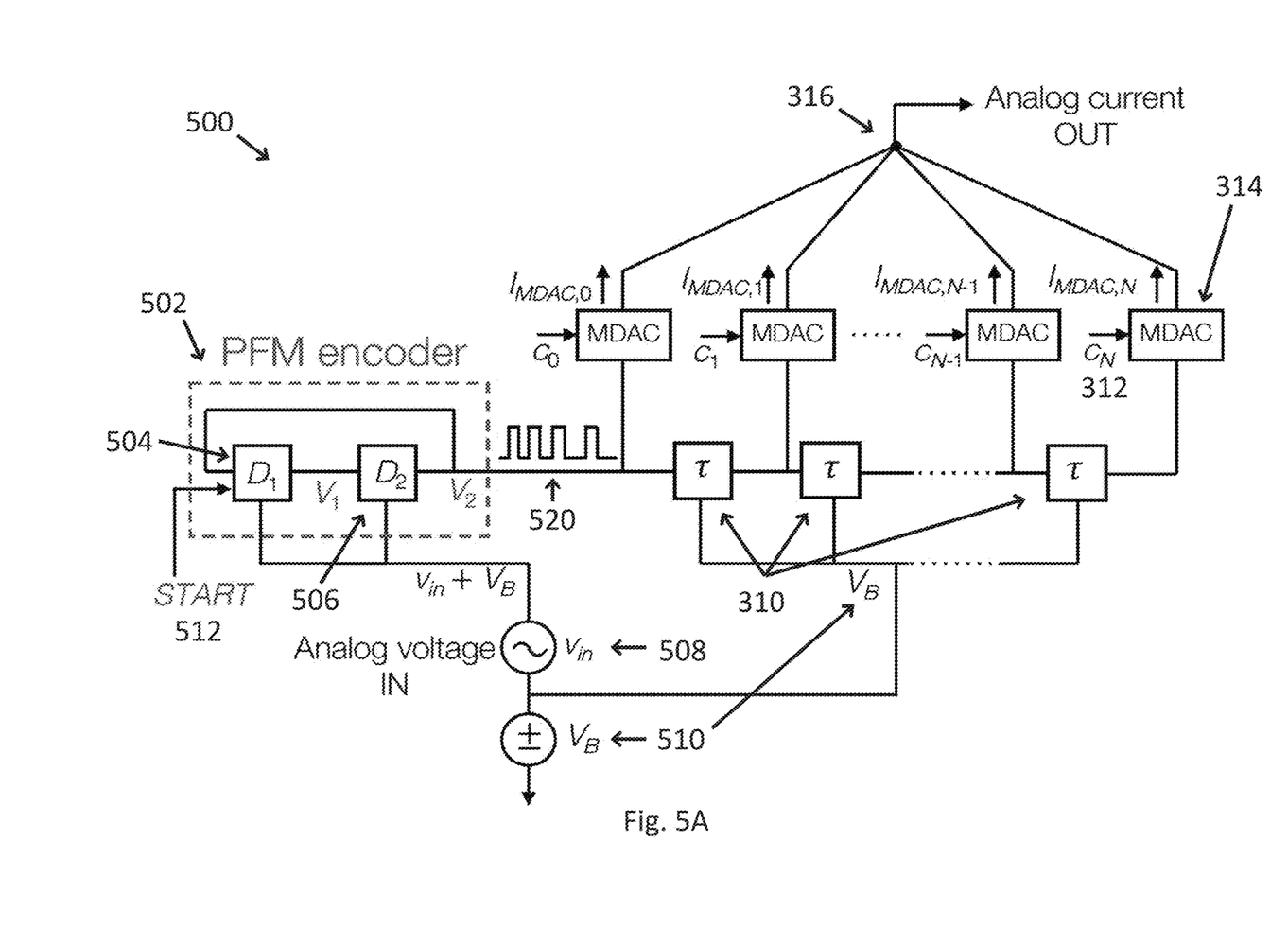
FIG. 5A shows an exemplary CT ADC/DSP/DAC system with a pulse-frequency modulation (PFM) encoder implemented by asynchronous digital delay blocks, according to aspects of the disclosure.

To use this delay in the PFM encoder, a voltage control oscillator (VCO) can be used, for example, a VCO implemented using a PFM encoder. FIG. 5A shows an exemplary continuous-time system 500 with a PFM encoder 502 implemented by asynchronous digital delay blocks 504 and 506 (also denoted as D1 and D2, respectively), which are connected in feedback. The voltage control terminals of the delay blocks 310 are connected to 510, $V_B$, thereby resulting in a delay of τ. The delay blocks 504 and 506 in encoder 502 are connected to $V_B+v_{in}(t)$, where $v_{in}$, ($\in[-A, A]$) is the analog input 508 that is to be encoded.

Figure 5B:
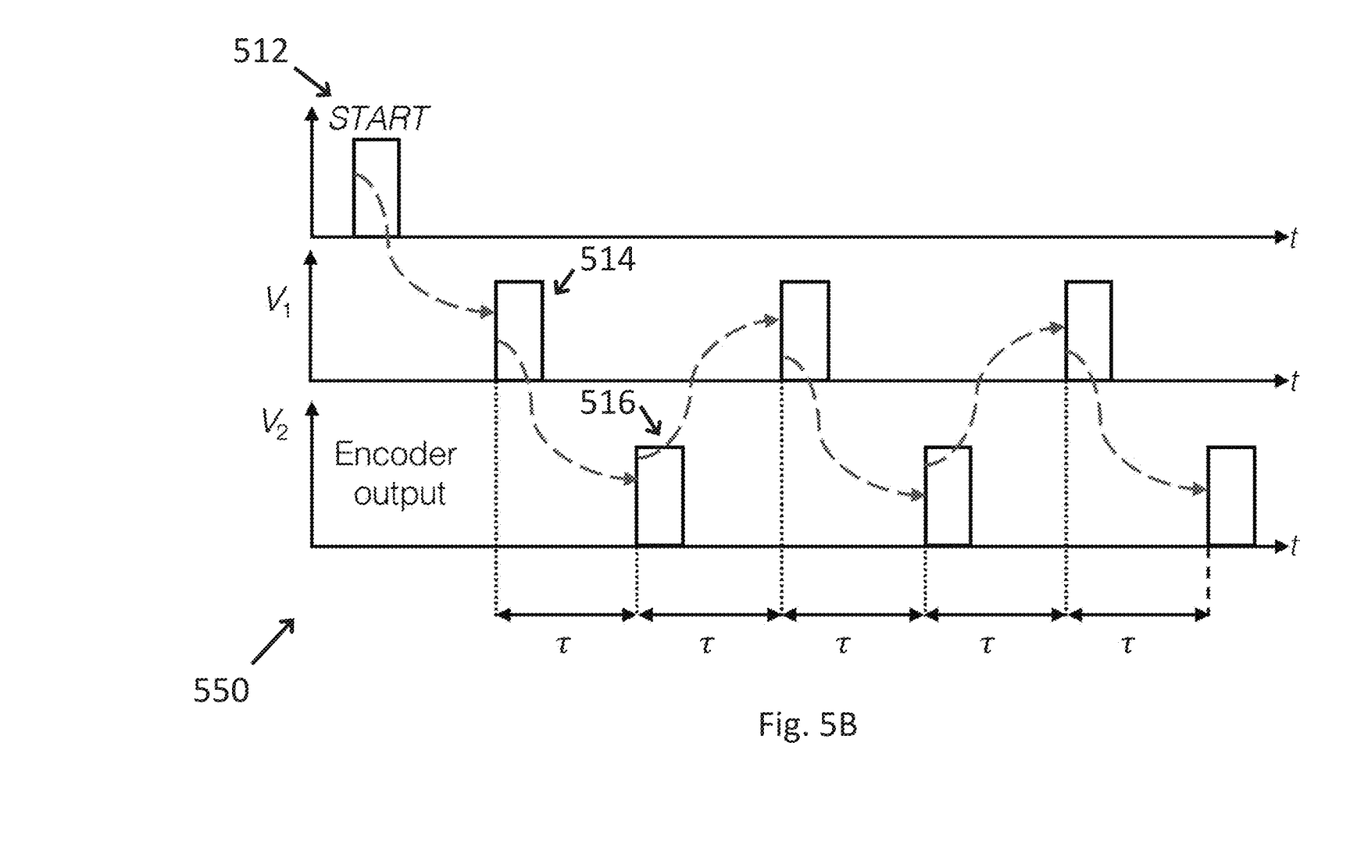
FIG. 5B shows exemplary waveforms at the PFM encoder terminals, according to aspects of the disclosure.

According to aspects of the disclosure, an external START launch pulse 512 may be applied to block 504, which can trigger the pulse frequency modulation encoder 502. FIG. 5B shows an exemplary illustration 550 of waveforms at the PFM encoder 502 terminals. Assuming $v_{in}$ of 508 to be zero for now, the control terminal of the delay blocks 504 and 506 in the encoder 502 are at $V_B$, resulting in a delay of $T_D(V_B)=\tau$. The initial START pulse 512 can trigger the delay block 504, which can produce a pulse 514 at its output, $V_1$, after a delay of τ. This new pulse 514 then can trigger delay block 506, and the latter, in turn, can generate another pulse 516 at its output, $V_2$, after a delay of τ. The pulse 516 at $V_2$ can trigger block 504 and the cycle repeats. Therefore, the initial START pulse 512 can circulate in the loop formed by the two delay blocks 504 and 506, and a unipolar pulse train can be produced at the output node, $V_2$, which also forms the encoder output 520 at FIG. 5A. This output 520 can be fed to the delay blocks 310.

From the input of 504 to the output of 506, every pulse can undergo a delay of two blocks: $2T_D(V_B)=2\tau$, resulting in a 2τ spacing in between the pulses at output $V_2$. This can result in a zero input (since $v_{in}=0$) pulse repetition frequency at output $V_2$ given by (using equation (6))

$$f_0 = \frac{1}{2\tau} = \frac{1}{2T_D(V_B)} = \frac{V_B}{2\beta} \quad (7)$$

When an input is applied (e.g., $v_{in}\neq 0$), the pulses at output $V_2$ can be separated in time by $2T_D(V_B+v_{in}(t))$, and the corresponding output pulse frequency will be:

$$f_{out}(t) = \frac{1}{2T_D(V_B+v_{in}(t))} \quad (8)$$

Using equations (6) and (7), the pulse repetition frequency at output $V_2$ becomes:

$$f_{out}(t) = \frac{V_B+v_{in}(t)}{2\beta} = f_0 + \frac{v_{in}(t)}{2\beta} \quad (9)$$

The two-delay encoder 502 in FIG. 5A can convert an input analog signal 508 into a train of unipolar CT digital pulses 520, whose frequency/repetition-rate can vary in linear proportion (with an offset) with the input through the relation given by equation (9). Therefore, it can function as a PFM encoder.

According to aspects of the disclosure, the system 500 can be designed using a single delay line composed of a cascade, e.g., two or more, of identical or similar voltage-controlled asynchronous digital delay blocks. The delay blocks 504 and 506 can be slightly different from those in the delay line, but similar enough so that they tract each other with process-voltage-temperature (PVT) variations. The first two delay blocks 504 and 506 can be connected in feedback and have their control terminal at $V_B+v_{in}(t)$, thereby forming the PFM encoder 502; the remaining blocks 310 are biased at $V_B$, and form the rest of the delay line. Due to the event-driven nature of the delay block, even two such blocks connected in a feedback loop can oscillate: every input trigger to the delay block will result in an output pulse, which can then circulate in the delay-block loop and produce an oscillatory output waveform of 550. An odd number (≥3) is not necessary as in ring oscillators, which need to satisfy the Barkhausen criterion for oscillations to generate sustained oscillations. In fact, even a single such block when connected in a similar feedback loop can oscillate.

According to aspects of the disclosure, the PFM encoder 502 can include digital delays. The encoder 502 can also generate continuous-time digital output with no sampling in time. Using the same or similar digital delay blocks to make both the analog-to-digital converter and the digital-signal-processing delay line can simplify the design of the system.

According to aspects of the disclosure, as r varies with process-voltage-temperature variations, the pulse repetition frequency $f_0$ can now track it due to the identical delay blocks in the analog-to-digital converter and the digital signal processing delay line. Therefore, out-of-band modulation products that result due to the PFM encoding, for example, spectrum 200 shown in FIG. 2, can also track such variations. Therefore, the rejection of the out-of-band modulation products that result due to the PFM encoding can be made robust to PVT variations.

According to aspects of the disclosure, delay blocks 504, 506 and 310 can be either in a delay mode or in a reset mode. In the encoder 502, when delay block 504 is in a delay mode, delay block 506 is in reset mode and vice versa. According to aspects of the disclosure, the reset operation in one delay block, for example, delay block 504, is completed before the other delay block, for example delay block 506, completes the delay operation and triggers delay block 504. Therefore, the amount of time allotted to the reset operation may need to be less than or equal to the delay of one block. According to aspects of the disclosure, an additional reset duration is desirable, especially with process-voltage-temperature variations. To allow for a greater reset duration, parallelization can be adopted: the delay line including the delay line of PFM encoder 502, for example, delay blocks 504 and 506, and delay line blocks 310 in FIG. 5A can be duplicated to create an exemplary parallelized version of the system 600 shown in FIG. 6.

Figure 6:
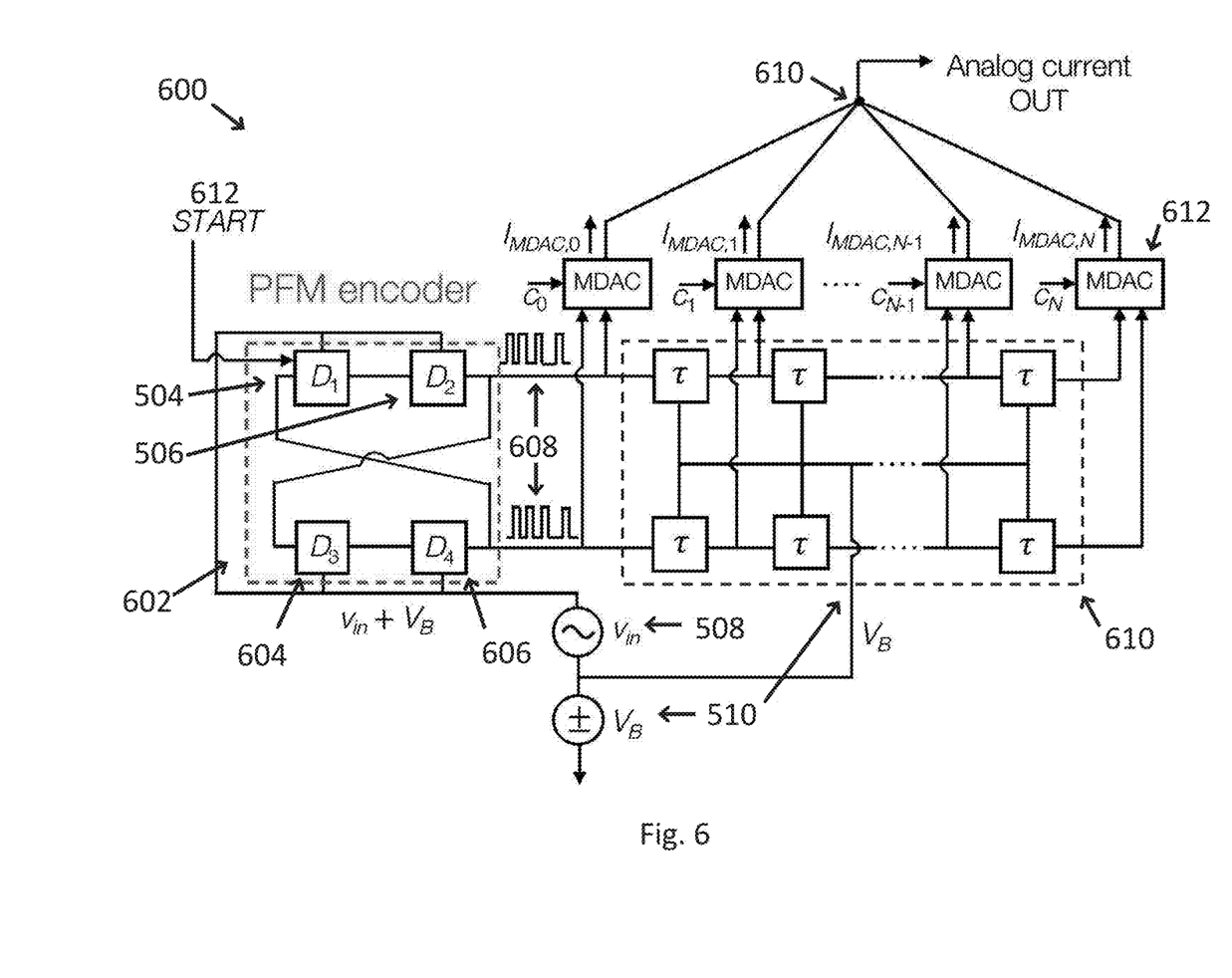
FIG. 6 shows an exemplary PFM encoder-based CT ADC/DSP/DAC system, according to aspects of the disclosure.

According to aspects of the disclosure, four delay blocks 504, 506, 604, and 606 in FIG. 6, instead of just two delay blocks can implement the PFM encoder 602. A START pulse 612 launched at the input of block 504 can circulate in a loop of delay blocks following the sequence 504→506→604→606 then back to 504 and the cycle can continue. That is, the pulse can circulate from $D_1 \rightarrow D_2 \rightarrow D_3 \rightarrow D_4$ and back to $D_1$ and so on Therefore, the reset duration of a delay block in the PFM encoder 602 can increase to the delay of the other three delay blocks and leave a sufficient margin. The continuous-time DSP of FIG. 6 is shown to have two delay lines. The pulse rate of 608 at the input to each delay line is half, and the minimum time between any two consecutive input pulses is twice, that of what it would be in the case of the system 500 in FIG. 5A with a single delay line. The tap outputs in the two delay lines in 610 of FIG. 6 can be combined in the MDAC 612 to form a single tap output, equivalent to what it would be in the system 500 in FIG. 5A. One MDAC can receive pulse rate of 608.

Figure 7:
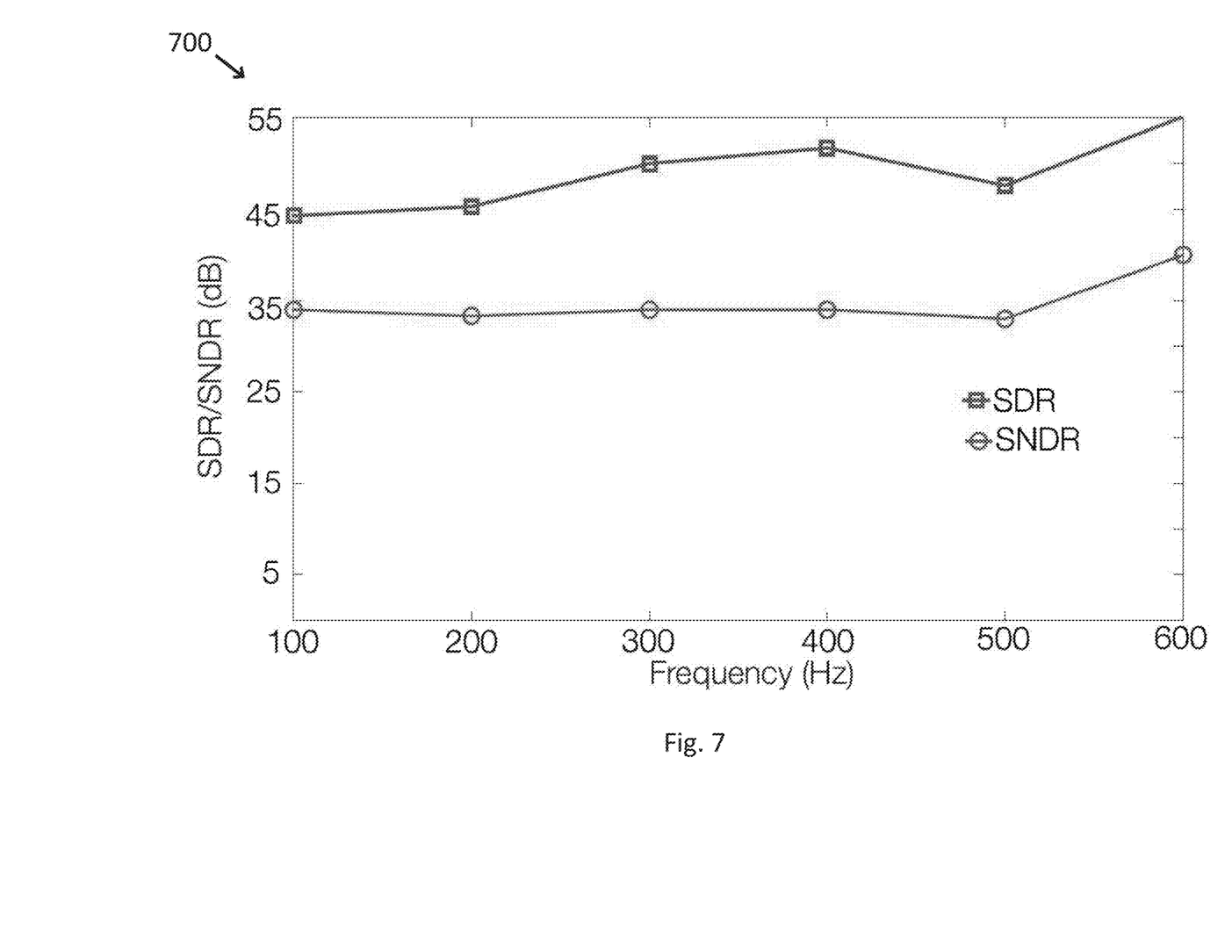
FIG. 7 shows an exemplary illustration of in-band signal-to-distortion ratio (SDR) and the signal-to-noise-and-distortion ratio (SNDR) of the PFM encoder output, according to aspects of the disclosure.

The plot of the in-band (0-600 MHz) signal-to-distortion ratio SDR and the signal-to-noise-and-distortion ratio (SNDR) of the PFM encoder output versus input frequency for full-scale single-tone inputs is shown at 700 in FIG. 7. As shown in FIG. 7, noise can limit more significantly limit the SNDR than distortion.

Figure 8A:
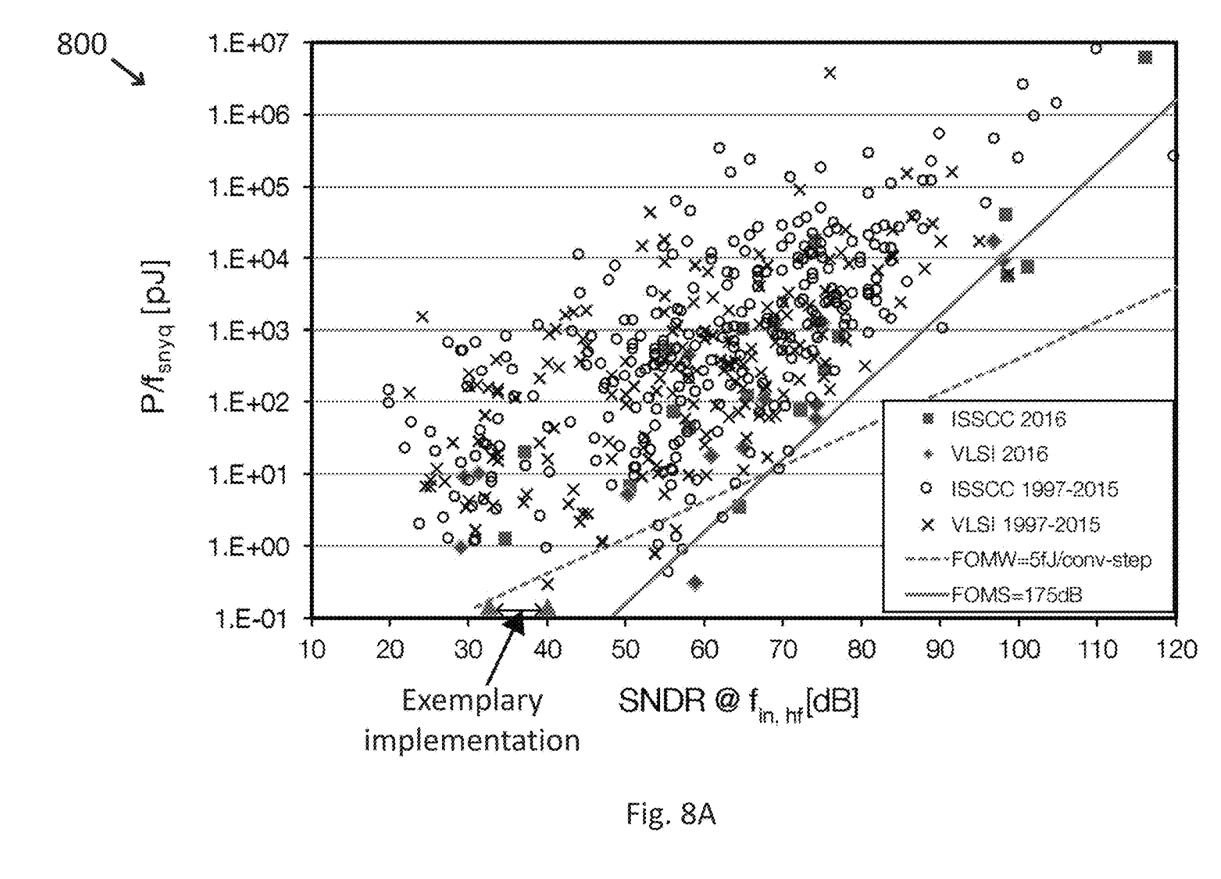
FIGS. 8A-B show exemplary illustrations of ADC performance, according to aspects of the disclosure.
Figure 8B:
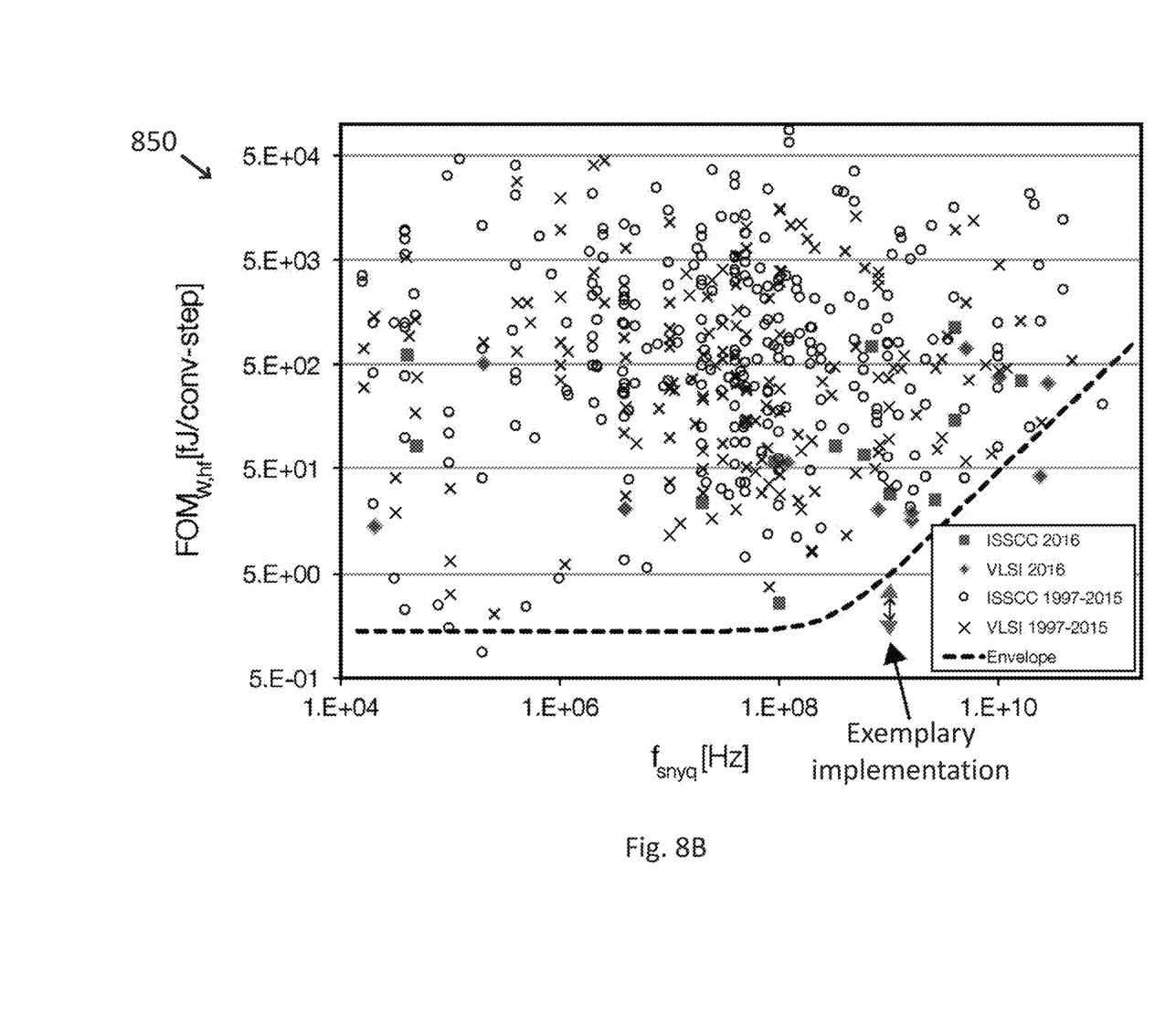

The performance of an exemplary implementation of the disclosed continuous-time system is summarized and compared with other prior continuous-time systems in Table 1. The power dissipation of the exemplary disclosed system is 176 μW. This results in a P/($2 \times f_{BW}$) of 0.15 pJ/sample and a Walden figure-of-merit (FOM) of 2-4 fJ/conv-step. The improvement over prior art CT ADCs is respectively 16×, 940×, 50×, and 2.5×. Its placement in the energy and FOM plots of the Murmann survey, which includes all published state-of-the-art ADCs, is shown in FIG. 8A at 800 and in FIG. 8B at 850. FIG. 8A at 800 shows the placement of the proposed ADC in the energy plot. FIG. 8B at 850 shows the placement of the proposed continuous-time ADC in the Walden FOM plot of the Murmann survey. Based on FIGS. 8A and 8B, the proposed continuous-time ADC out performs the state-of-the-art CT and DT ADCs.

TABLE 1

Comparison of the PFM continuous-time ADC with prior-published CT ADCs

|  | Prior art | Prior art | Prior art | Prior art | Disclosed CT ADC |
|---|---|---|---|---|---|
| Technology | 90 nm CMOS | 65 nm CMOS | 130 nm CMOS | 28 nm UTBB FDSOI CMOS | 28 nm UTBB FDSOI CMOS |
| Supply (V) | 1 | 1.2 | 1 | 0.65 | 1.2 |
| Input bandwidth, $f_{BW}$ | 10 kHz | 2.4 GHz | 20 kHz | 40 MHz | 600 MHz |
| Core area (mm²) | 0.06 | 0.0036 | 0.36 | 0.0032 | — |
| SNDR (dB) | 58 | 20.3 | 47-54[a] | 32-42[a] | 33-40[a] |
| Total power (μW) | 50 | 2700 | 2-8 | 24 | 176 |
| Figure of Merit (fJ/conv-step) | 3769 | 66 | 200-850 | 3-10 | 2-4 |
| P/(2 × $f_{BW}$) (pJ) | 2500 | 0.56 | 200 | 0.3 | 0.15 |
| Antialiasing filter required? | No | No | No | No | Yes |

[a]SNDR varies with input frequency.

Table 2 compares the proposed continuous-time ADC/DSP/DAC system with relevant state-of-the-art CT DSP, DT DSP, and analog processors $FOM_{DSP}$, which is expressed as $$\frac{P}{2 \times f_{BW} \times N_{taps} \times 2^{(SNDR-1.76)/6}}$$

can be used for comparison. Compared to prior art systems, the proposed system achieves an $FOM_{DSP}$ improvement of 7.5×, 3.7×, and 12.7× respectively, while being at par with another prior art DT DSP system, with an $FOM_{DSP}$ of 5 fJ/sample (it is not shown in the table due to its rather high sampling rate (16 GS/s)).

TABLE 2

Comparison of the disclosed continuous-time system with prior art continuous-time DSP, discrete-time DSP, and analog processors.

|  | Prior art | Prior art | Prior art | Disclosed CT ADC |
|---|---|---|---|---|
| Technology | 65 nm CMOS | 32 nm CMOS | 45 nm CMOS | 28 nm UTBB FDSOI CMOS |
| Supply (V) | 1.2 | 1 | 1.1 | 1.2 |
| Nature | CT mixed-domain DSP | DT DSP | Analog FIR | CT mixed-domain DSP |

TABLE 2-continued

Comparison of the disclosed continuous-time system with prior art continuous-time DSP, discrete-time DSP, and analog processors.

|  | Prior art | Prior art | Prior art | Disclosed CT ADC |
|---|---|---|---|---|
| Input bandwidth, $f_{BW}$ | 2.4 GHz (0.8 GHz-3.2 GHz) | 1.05 GHz | 800 MHz | 600 MHz |
| Average sample rate | 0-45 GS/s | 2.1 GS/s | 3.2 GHz | 4.2 GHz |
| Core area (mm$^2$) | 0.073 | 0.004 | 0.15 | — |
| SNDR (dB) | 20.3 | 48 | 33 (SNR) | 33-40 |
| Total power, P (mW) | 6.2 mW (average) | 24 | 48 | 2.9 |
| # of taps, $N_{taps}$ | 6 | 4 | 16 | 16 |
| $FOM_{DSP}$ (fJ/sample) | 30 | 15 | 51 | 4 |
| Antialiasing filter required? | No | Yes | Yes, but relaxed | Yes |

The PFM-encoder-based continuous-time ADC/DSP/DAC system can be digital and can be implemented with the analog-to-digital converter and the digital signal processing delay lines using similar asynchronous digital delay blocks. This can result in a system scalable with technology and amenable to a low-supply implementation. Simulations of the disclosed continuous-time system demonstrate that the overall system can achieve a high energy efficiency that is better than prior art continuous-time DSPs and at par with prior art digital-time DSPs.

The invention claimed is:

1. A continuous-time system comprising:
a continuous-time analog-to-digital converter (ADC) configured to receive an analog input and to generate an ADC output;
a continuous-time digital signal processor configured to receive the ADC output and generate one or more digital outputs;
one or more digital-to-analog converters configured to receive the one or more digital outputs, each digital-to-analog converter configured to receive a corresponding digital output and generate an analog output; and
an adder configured to receive the analog outputs of the one or more digital-to-analog converters and to generate a summed analog output;
wherein the continuous-time analog-to-digital converter comprises one or more asynchronous digital delay blocks, each asynchronous digital delay block having a tunable delay.

2. The continuous-time system of claim 1, wherein the ADC output comprises one or more continuous-time digital fixed-width pulses having a repetition rate determined based on an amplitude of the analog signal.

3. The continuous-time system of claim 1, wherein the tunable delay is determined based on the analog input.

4. The continuous-time system of claim 1, wherein the one or more asynchronous digital delay blocks form a feedback loop.

5. The continuous-time system of claim 1, wherein the continuous-time digital signal processor comprises one or more asynchronous digital delay blocks, each asynchronous digital delay block of the continuous-time digital signal processor having a tunable delay.

6. The continuous-time system of claim 5, wherein the ADC output is multiplied by a first coefficient, wherein the ADC output is configured to propagate through the one or more asynchronous digital delay blocks, and wherein the ADC output is further multiplied by a corresponding coefficient after the ADC output propagates through each of the one or more asynchronous digital delay blocks.

7. The continuous-time system of claim 1, wherein the continuous-time analog-to-digital converter comprises a first set of one or more asynchronous digital delay blocks and a second set of one or more asynchronous digital delay blocks, wherein the continuous-time analog-to-digital converter is further configured to generate a second ADC output, and wherein an asynchronous digital delay block of the first set of one or more asynchronous digital delay blocks generates the ADC output and an asynchronous digital delay block of the second set of one or more asynchronous digital delay blocks generates the second ADC output.

8. The continuous-time system of claim 7, wherein the continuous-time digital signal processor is further configured to receive the second ADC output and wherein the continuous-time digital signal processor comprises a third set of one or more asynchronous digital delay blocks configured to receive the ADC output and a fourth set of one or more asynchronous digital delay blocks configured to receive the second ADC output.

9. The continuous-time system of claim 8, wherein the ADC output and the second ADC output are multiplied by a first coefficient, wherein the ADC output is configured to propagate through the third set of one or more asynchronous digital delay blocks, wherein the second ADC output is configured to propagate through the fourth set of one or more asynchronous digital delay blocks, and wherein the ADC output and the second ADC output are further multiplied by a corresponding coefficient after the ADC output propagates through each of the one or more asynchronous digital delay blocks of the third set of one or more asynchronous digital delay blocks and after the second ADC output propagates through each of the one or more asynchronous digital delay blocks of the fourth set of one or more asynchronous digital delay blocks.

10. A method for continuous-time processing comprising the steps of:
receiving, by a continuous-time analog-to-digital converter (ADC), an analog input and to generate an ADC output;
receiving, by a continuous-time digital signal processor, the ADC output and generate one or more digital outputs;
receiving, by one or more digital-to-analog converters, the one or more digital outputs, each digital-to-analog converter configured to receive a corresponding digital output and generate an analog output; and summing, by an adder, the analog outputs of the one or more digital-to-analog converters to generate a summed analog output;

wherein the continuous-time analog-to-digital converter comprises one or more asynchronous digital delay blocks, each asynchronous digital delay block having a tunable delay.

11. The method of claim 10, wherein the ADC output comprises one or more continuous-time digital fixed-width pulses having a repetition rate determined based on an amplitude of the analog signal.

12. The method of claim 10, further comprising determining the tunable delay based on the analog input.

13. The method of claim 10, wherein the one or more asynchronous digital delay blocks form a feedback loop.

14. The method of claim 10, wherein the continuous-time digital signal processor comprises one or more asynchronous digital delay blocks, each asynchronous digital delay block of the continuous-time digital signal processor having a tunable delay.

15. The method of claim 14, further comprising:
multiplying the ADC output by a first coefficient;
propagating the ADC output through the one or more asynchronous digital delay blocks, and
multiplying the ADC output by a corresponding coefficient after the ADC output propagates through each of the one or more asynchronous digital delay blocks.

16. The method of claim 10, further comprising generating, by the continuous-time analog-to-digital converter, a second ADC output, and wherein the ADC output is generated by an asynchronous digital delay block of a first set of one or more asynchronous digital delay blocks, and wherein the second ADC output is generated by an asynchronous digital delay block of a second set of one or more asynchronous digital delay blocks.

17. The method of claim 16, further comprising:
receiving, by a third set of one or more asynchronous digital delay blocks in the continuous-time digital signal processor, the ADC output; and
receiving, by a fourth set of one or more asynchronous digital delay blocks in the continuous-time digital signal processor, the second ADC output.

18. The method of claim 17, further comprising:
multiplying the ADC output and the second ADC output by a first coefficient;
propagating the ADC output through the third set of one or more asynchronous digital delay blocks;
propagating the second ADC output through the fourth set of one or more asynchronous digital delay blocks; and
multiplying the ADC output and the second ADC output by a corresponding coefficient after the ADC output propagates through each of the one or more asynchronous digital delay blocks of the third set of one or more asynchronous digital delay blocks and after the second ADC output propagates through each of the one or more asynchronous digital delay blocks of the fourth set of one or more asynchronous digital delay blocks.

* * * * *